(12) United States Patent
Annunziata et al.

(10) Patent No.: US 9,947,863 B2
(45) Date of Patent: *Apr. 17, 2018

(54) STRUCTURE AND METHOD TO REDUCE SHORTING IN STT-MRAM DEVICE

(71) Applicant: International Business Machines Corporation, Armonk, NY (US)

(72) Inventors: Anthony J. Annunziata, Stamford, CT (US); Gen P. Lauer, Yorktown Heights, NY (US); Nathan P. Marchack, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/493,270

(22) Filed: Apr. 21, 2017

(65) Prior Publication Data
US 2017/0222134 A1  Aug. 3, 2017

Related U.S. Application Data

(63) Continuation of application No. 15/202,821, filed on Jul. 6, 2016, now Pat. No. 9,673,386, which is a
(Continued)

(51) Int. Cl.
*H01L 43/08* (2006.01)
*H01L 43/12* (2006.01)
(Continued)

(52) U.S. Cl.
CPC ............ *H01L 43/08* (2013.01); *G11C 11/161* (2013.01); *H01L 43/10* (2013.01); *H01L 43/12* (2013.01)

(58) Field of Classification Search
CPC ....................................................... H01L 43/08
See application file for complete search history.

(56) References Cited

U.S. PATENT DOCUMENTS 9,450,180 B1    9/2016  Annunziata et al.
9,502,640 B1    11/2016 Annunziata et al.
(Continued)

OTHER PUBLICATIONS

List of IBM Patents or Patent Applications Treated as Related; (Appendix P), Filed May 23, 2017; 2 pages.

*Primary Examiner* — William Coleman
(74) *Attorney, Agent, or Firm* — Cantor Colburn LLP; Vazken Alexanian

(57) ABSTRACT

A method of making a magnetic random access memory (MRAM) device includes depositing a spacer material on an electrode; forming a magnetic tunnel junction (MTJ) on the spacer material that includes a reference layer in contact with the spacer material, a free layer, and a tunnel barrier layer; patterning a hard mask on the free layer; etching the MTJ and the spacer material to transfer a pattern of the hard mask into the MTJ and the spacer material; forming an insulating layer along a sidewall of the hard mask, the MTJ, and the spacer material; disposing an interlayer dielectric (ILD) on and around the hard mask, MTJ, and spacer material; etching through the ILD to form a trench that extends to a surface and sidewall of the hard mask and a sidewall of a portion of the MTJ; and disposing a metal in the trench to form a contact electrode.

20 Claims, 3 Drawing Sheets

Related U.S. Application Data continuation of application No. 14/968,287, filed on Dec. 14, 2015, now Pat. No. 9,450,180, which is a continuation of application No. 14/931,141, filed on Nov. 3, 2015, now Pat. No. 9,502,640.

(51) Int. Cl.
  *H01L 43/10* (2006.01)
  *G11C 11/16* (2006.01)

(56) References Cited

U.S. PATENT DOCUMENTS

| | | |
|---|---|---|
| 9,673,386 B2 * | 6/2017 | Annunziata ............. H01L 43/08 |
| 2017/0125480 A1 | 5/2017 | Annunziata et al. |
| 2017/0125667 A1 | 5/2017 | Annunziata et al. |

* cited by examiner

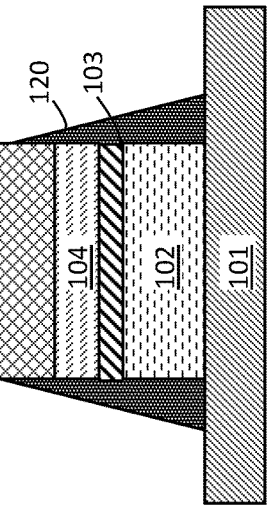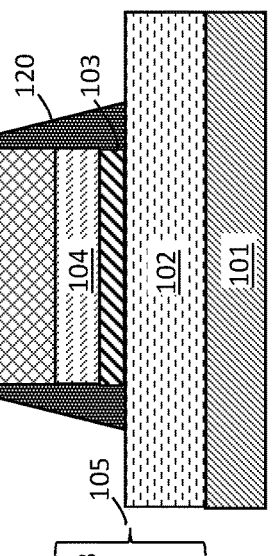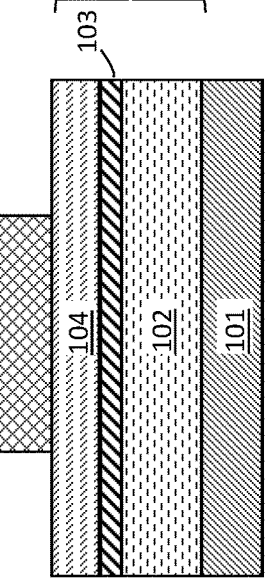

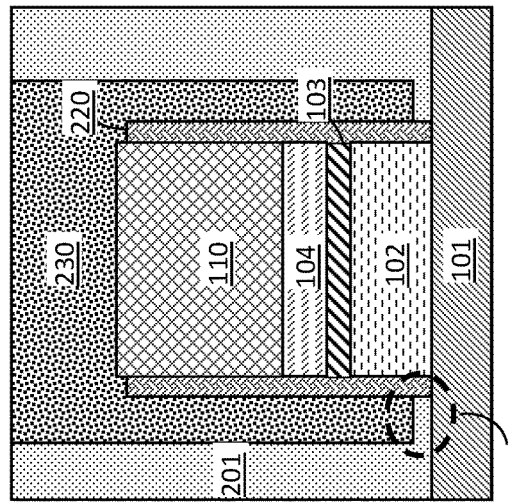
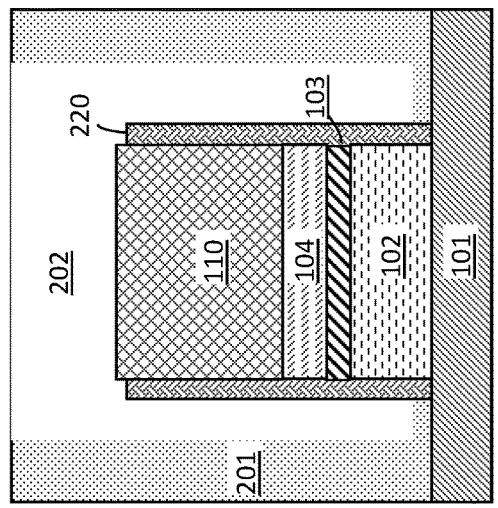
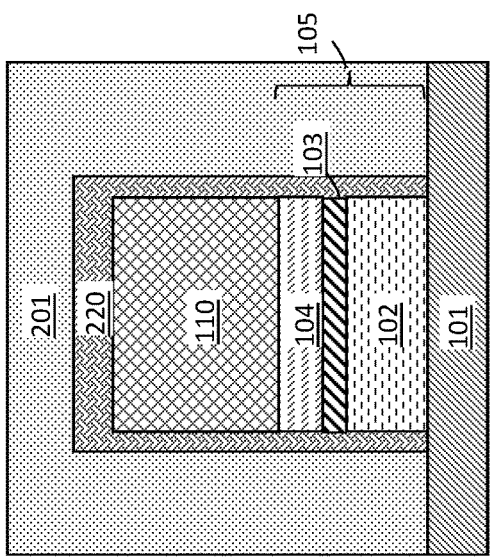
FIG. 2C
FIG. 2B
FIG. 2A

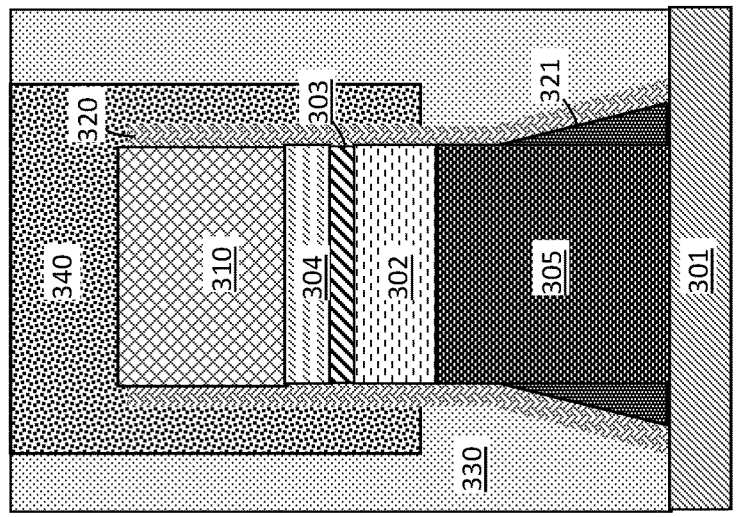
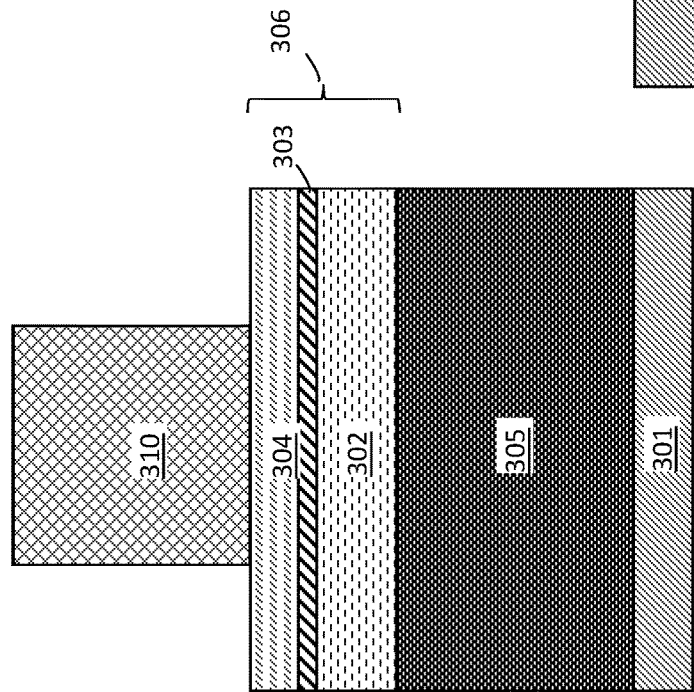
FIG. 3C
FIG. 3B
FIG. 3A

STRUCTURE AND METHOD TO REDUCE SHORTING IN STT-MRAM DEVICE

DOMESTIC PRIORITY

This application is a continuation of and claims priority from U.S. patent application Ser. No. 15/202,821, filed on Jul. 6, 2016, entitled "STRUCTURE AND METHOD TO REDUCE SHORTING IN STT-MRAM DEVICE," which is a continuation of and claims priority from U.S. patent application Ser. No. 14/968,287, filed on Dec. 14, 2015, entitled "STRUCTURE AND METHOD TO REDUCE SHORTING IN STT-MRAM DEVICE," which is a continuation of and claims priority from U.S. patent application Ser. No. 14/931,141, filed on Nov. 3, 2015, entitled "STRUCTURE AND METHOD TO REDUCE SHORTING IN STT-MRAM DEVICE," the entire contents of each application are incorporated herein by reference.

BACKGROUND

The present invention relates to spin-transfer torque magnetoresistive random access memory (STT-MRAM devices), and more specifically, to stack structures and etch processes in STT-MRAM devices.

STT-MRAM devices have some benefits over semiconductor-based memories, such as dynamic random-access memory (DRAM) and static random-access memory (SRAM). However, in order to compete with DRAM and SRAM, the STT-MRAM devices are integrated into the wiring layers of standard silicon logic and memory chips.

A STT-MRAM device is a type of solid state, non-volatile memory that uses tunneling magnetoresistance (TMR or MR) to store information. MRAM includes an electrically connected array of magnetoresistive memory elements, referred to as magnetic tunnel junctions (MTJs). Each MTJ includes a free layer and fixed/reference layer that each includes a magnetic material layer. The free and reference layers are separated by a non-magnetic insulating tunnel barrier. The free layer and the reference layer are magnetically de-coupled by the tunnel barrier. The free layer has a variable magnetization direction, and the reference layer has an invariable magnetization direction.

An MTJ stores information by switching the magnetization state of the free layer. When the free layer's magnetization direction is parallel to the reference layer's magnetization direction, the MTJ is in a low resistance state. Conversely, when the free layer's magnetization direction is antiparallel to the reference layer's magnetization direction, the MTJ is in a high resistance state. The difference in resistance of the MTJ may be used to indicate a logical '1' or '0', thereby storing a bit of information. The TMR of an MTJ determines the difference in resistance between the high and low resistance states. A relatively high difference between the high and low resistance states facilitates read operations in the MRAM.

SUMMARY

According to an embodiment, a method of making a magnetic random access memory (MRAM) device includes depositing a spacer material on an electrode; forming a magnetic tunnel junction (MTJ) on the spacer material that includes a reference layer in contact with the spacer material, a free layer, and a tunnel barrier layer; patterning a hard mask on the free layer; etching the MTJ and the spacer material to transfer a pattern of the hard mask into the MTJ and the spacer material; forming an insulating layer along a sidewall of the hard mask, the MTJ, and the spacer material; disposing an interlayer dielectric (ILD) on and around the hard mask, MTJ, and spacer material; etching through the ILD to form a trench that extends to a surface and sidewall of the hard mask and a sidewall of a portion of the MTJ; and disposing a metal in the trench to form a contact electrode.

According to another embodiment, a method of making a magnetic random access memory (MRAM) device includes depositing a spacer material on an electrode; forming a magnetic tunnel junction (MTJ) on the spacer material, the MTJ comprising a reference layer positioned in contact with the spacer material, a free layer, and a tunnel barrier layer arranged between the reference layer and the free layer, the reference layer and the free layer including a magnetic material; patterning a hard mask on the free layer of the MTJ; etching the MTJ and the spacer material to transfer a pattern of the hard mask into the MTJ and the spacer material; forming an insulating layer along a sidewall of the hard mask, the MTJ, and the spacer material; disposing an interlayer (ILD) on and around the hard mask, the MTJ, and the spacer material; etching through the ILD to form a trench that extends to a surface of the hard mask, along a sidewall of the hard mask, and along a sidewall of a portion of the MTJ; and disposing a metal in the trench to form a contact electrode; wherein etching the MTJ redeposits a portion of the magnetic material of the reference layer or the free layer onto the sidewall of the spacer material beneath the insulating layer.

Yet, according to another embodiment, a magnetic random access memory (MRAM) device includes a spacer disposed on an electrode; a magnetic tunnel junction (MTJ) disposed on the spacer, the MTJ comprising a reference layer, a free layer, and a tunnel barrier layer between the reference layer and the free layer, and the reference layer positioned in contact with the spacer; a hard mask disposed on the free layer of the MTJ; an interlayer (ILD) disposed on and around the hard mask, the MTJ, and the spacer; an insulating layer positioned along a sidewall of the hard mask, MTJ, and spacer; and a trench that extends through the ILD and includes a metal that forms a contact electrode, the contact electrode positioned in contact with a surface of the hard mask, a sidewall of the hard mask, and a sidewall of a portion of the MTJ.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1A-1C illustrate methods of making MRAM devices that may result in redeposition shorting, in which:

FIG. 1A is a cross-sectional side view of a patterned hard mask disposed on a MTJ stack;

FIG. 1B is a cross-sectional side view after etching the free layer and the tunnel barrier layer of the MTJ stack;

FIG. 1C is a cross-sectional side view after etching the reference layer of the MTJ stack;

FIGS. 2A-2C illustrate methods of making MRAM devices that may result in top metal trench shorting, in which:

FIG. 2A is a cross-sectional side view of a patterned MTJ stack surrounded by an interlayer dielectric (ILD) layer;

FIG. 2B is a cross-sectional side view after forming a trench in the ILD layer;

FIG. 2C is a cross-sectional side view after depositing a metal in the trench;

FIGS. 3A-3C illustrate exemplary methods of making MRAM devices according to various embodiments, in which:

FIG. 3A is a cross-sectional side view after patterning a hard mask on a MTJ stack disposed on a spacer;

FIG. 3B is a cross-sectional side view after etching the MTJ stack and spacer; and FIG. 3C is a cross-sectional side view after disposing an insulating layer and an ILD layer on the hard mask and the electrode layer, forming a trench in the ILD layer, and disposing a metal in the trench.

DETAILED DESCRIPTION

One challenge of integrating STT-MRAM devices into the wiring layers of silicon logic and memory chips is subtractive etching of the magnetic stack from a blanket film, which defines the STT-MRAM device. Specialized reactive ion etches (RIE) and inert ion beam etches (IBE) may be used for the subtractive etching. However, RIE processes for etching MRAM may cause device degradation. Although IBE processes may not induce magnetic damage, they may cause metal redeposition. The metal redeposition may induce shorting across the tunnel barrier in the STT-MRAM stack, which may detract from yield. Oxidizing the redeposited metal to make it insulative may remove the redeposited metal, but the oxidation process itself could cause device degradation.

For example, FIGS. 1A-1C illustrate methods of making MRAM devices that may result in redeposition shorting. FIG. 1A is a cross-sectional side view of a patterned hard mask 110 disposed on a MTJ stack 105. The MTJ stack 105 includes a reference layer 102, a tunnel barrier layer 103, and a free layer 104. The reference layer 102 and the free layer 104 include conductive, magnetic metals or metal alloys. The MTJ stack 105 is disposed on a contact electrode 101 (bottom contact). A hard mask 110 is disposed on the MTJ stack 105. The hard mask 110 is then patterned.

FIG. 1B is a cross-sectional side view after transferring the pattern of the hard mask 110 into the free layer 104 and the tunnel barrier layer 103 of the MTJ stack 105. The free layer 104 and the tunnel barrier layer 103 are etched, by, for example, a RIE or IBE process. During the etch process, the magnetic material of the free layer 104 is redeposited along the sidewalls of the free layer 104, the tunnel barrier layer 103, and the hard mask 110.

FIG. 1C is a cross-sectional side view after etching the reference layer 102 of the MTJ stack 105. Etching the reference layer 104 results in even more magnetic material being deposited along the sidewalls of the MTJ stack 105, including along the reference layer 102 sidewalls. The redeposited magnetic material may induce shorting along the tunnel barrier 103.

Another challenge of integrating MRAM devices is making an electrical contact to the top of the device. A damascene metal wire contacting process, in which the damascene trench etch is used to make contact to the top of the hard mask of the device, may be used to form the contact. In some integration schemes, the trench should be deep enough that the metal damascene trench extends sufficiently close to the tunnel barrier, which may change or improve the device performance. In such a scheme, a dielectric spacer that etches more slowly than the interlayer dielectric and leaves a thin dielectric separating the trench from the MRAM device may mitigate shorting. However, the "deep trench" scheme may still lead to shorting to the bottom contact when the tunnel barrier is close to the bottom contact.

For example, FIGS. 2A-2C illustrate methods of making MRAM devices that may result in top metal trench shorting. FIG. 2A is a cross-sectional side view of a patterned MTJ stack 105 surrounded by an interlayer dielectric (ILD) layer 201. The MTJ stack 105 includes a reference layer 102, a tunnel barrier layer 103, and a free layer 104. The reference layer 102 and the free layer 104 include conductive, magnetic metals or metal alloys. The MTJ stack 105 is disposed on a contact electrode 101 (bottom contact). A patterned hard mask 110 is disposed on the MTJ stack 105. The pattern of the hard mask 110 extends through the MTJ stack 105. An insulating layer 220 surrounds the hard mask 110 and the MTJ stack 105. The insulating layer 220 may include, for example, silicon nitride. An ILD layer 201 surrounds the insulating layer 220 and contacts the contact electrode 101. The ILD layer 201 may include, for example, an oxide, e.g., silicon dioxide.

Although redeposition of magnetic material may occur along sidewalls of the MTJ stack 105 and/or hard mask 110 when the MTJ stack 105 is etched, any redeposited magnetic material is not shown because it may be removed by, for example, oxidation or other methods.

FIG. 2B is a cross-sectional side view after forming a trench 202 in the ILD layer 201. The trench 202 extends through the ILD layer 201 down to a level alongside the tunnel barrier layer 103 or the reference layer 102.

FIG. 2C is a cross-sectional side view after depositing a metal 230, e.g., copper, using a metallization process in the trench 202 to form a top contact. Because the surface of the metal 230 in the trench 202 is close to the contact electrode 101, shorting in the region 240 may occur.

Accordingly, various embodiments provide a stack structure and etch processes that reduce the probability of shorting caused by metal redeposition on the MTJ sidewalls, as well as reduce the probability of the trench shorting to the bottom contact. The methods include disposing a conductive spacer layer under the MTJ stack. The conductive spacer layer is deposited as part of the MTJ stack deposition process. RIE and/or IBE processes etch the conducting layer with selectivity against the hard mask. The conducting layer may be, for example, ruthenium (Ru). Although, other metals and semiconductors may be used for the conducting layer. The conductive spacer layer is etched, except for the portion disposed beneath the MTJ stack.

The etching also partially recesses the contact/substrate around the STT-MRAM device. The recessed contact/substrate is a source of the magnetic material redeposition. Because the recessed contact/substrate is further away from the tunnel barrier, redeposition is less likely to collect on the tunnel barrier, and therefore, shorting is less likely.

Furthermore, since the tunnel barrier is effectively raised further above the bottom contact, a deep trench, which extends down to a level near the tunnel barrier, is further from the bottom contact, which also reduces the chances of shorting to the bottom contact. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Turning again to the Figures, FIGS. 3A-3C illustrate exemplary methods of making MRAM devices according to various embodiments. FIG. 3A is a cross-sectional side view after patterning a hard mask 310 on a MTJ stack 306 disposed on a spacer 305. The MTJ stack 306 includes a reference layer 302, a tunnel barrier layer 303, and a free layer 304. The spacer 305 is disposed on a contact electrode 301.

The contact electrode 301 includes a conductive material(s) and forms the bottom contact electrode of the MRAM device. Non-limiting examples of conductive materials for the contact electrode include tantalum, tantalum nitride, titanium, or any combination thereof.

The contact electrode 301 may be formed by depositing a conductive material(s) onto a surface. The conductive material(s) may be deposited by, for example, physical vapor deposition (PVD), ion beam deposition (IBD), atomic layer deposition (ALD), or like processes.

The spacer 305 is formed on the contact electrode 301. The spacer 305 may be formed by performing a deposition process, for example, a physical vapor deposition process (PVD) (e.g., sputtering), to deposit one or more conductive materials on the contact electrode 305. The spacer 305 may include one layer or multiple layers of conductive materials. For example, the spacer 305 may include ruthenium, niobium, palladium, or any combination thereof. The spacer 305 may include a highly doped semiconductor material that is conductive. For example, the spacer 305 may include, for example, doped polysilicon.

The thickness of the spacer 305 may generally vary and is not intended to be limited. In some embodiments, the thickness of the spacer 305 is in a range from about 20 to about 50 nm. In other embodiments, the thickness of the spacer 305 is in a range from about 25 to about 45 nm.

To form the MTJ stack 306, the reference layer 302 is formed on the spacer 305, the tunnel barrier layer 303 is formed on the reference layer 302, and the free layer 304 is formed on the tunnel barrier layer 303.

The reference layer 302 and the free layer 304 include conductive, magnetic materials, for example, metals or metal alloys. The reference layer 302 and the free layer may be formed by employing a deposition process, for example, PVD, IBD, ALD, or other like processes.

The reference layer 302 and the free layer 304 may include one layer or multiple layers. The reference layer 302 and the free layer 304 may include the same materials and/or layers or different materials and/or layers.

Non-limiting examples of suitable materials for the reference layer 302 include iron, cobalt, boron, aluminum, nickel, silicon, oxygen, carbon, zinc, beryllium, vanadium, boron, magnesium, or any combination thereof.

The reference layer 302 has a thickness that may generally vary and is not intended to be limited. In some embodiments, the reference layer 302 has a thickness in a range from about 5 to about 25 nm. In other embodiments, the reference layer 302 has a thickness in a range from about 10 to about 15 nm.

The free layer 304 has a thickness that may generally vary and is not intended to be limited. In some embodiments, the free layer 304 has a thickness in a range from about 5 to about 25 nm. In other embodiments, the free layer 304 has a thickness in a range from about 10 to about 15 nm.

The tunnel barrier layer 303 includes a non-magnetic, insulating material. A non-limiting example of an insulating material for the tunnel barrier layer 330 includes magnesium oxide (MgO). The tunnel barrier layer 303 may be formed on the reference layer 302 by, for example, radiofrequency (RF) sputtering in some embodiments. Alternatively, the tunnel barrier layer 303 is formed by oxidation (e.g., natural or radical oxidation) of a magnesium (Mg) layer deposited on the reference layer 302. After oxidation, the MgO layer may then be capped with a second layer of Mg.

A hard mask material layer is disposed on the MTJ stack 305. The hard mask material layer may include one or more conductive materials. The material forming the hard mask may be deposited by employing a deposition process, for example, PVD, IBD, or other like processes. Non-limiting examples of conductive materials for the hard mask material layer include tantalum nitride, titanium, titanium nitride, or any combination thereof.

The hard mask material layer is then patterned by etching to form the hard mask 310. The hard mask 310 may be etched by employing a reactive ion etch (RIE) process or a halogen-based chemical etch process (e.g., including chlorine-containing gas and/or fluorine-containing gas chemistry). The hard mask 310 and the free layer 304 are etched at different rates such that the hard mask 310 is etched and the free layer 304 remains un-etched.

FIG. 3B is a cross-sectional side view after etching the MTJ stack 306 and spacer 305. The pattern from the hard mask 310 is transferred into the free layer 304, tunnel barrier layer 303, reference layer 302, and the spacer 305. The free layer 304, tunnel barrier layer 303, and reference layer 302 are etched by, for example, performing a MRAM stack etch process. The stack etch process may be a RIE process or an ion beam etch (IBE) process.

The stack etch process etches the spacer 305 without substantially further etching the hard mask 310. Etching the MTJ stack 306 and the spacer 305 does not substantially degrade the hard mask 310.

Because the MTJ stack 306 includes magnetic materials (e.g., metal or metal alloys), etching the MTJ stack redeposits a portion of the magnetic material along a portion of the sidewall of the spacer 305, as shown in FIG. 3C (redeposition 321).

FIG. 3C is a cross-sectional side view after depositing an insulating layer 320 and an ILD layer 330, forming a trench in the ILD layer 330, and disposing a metal 340 in the trench to form a second contact.

The insulating layer 320 may include one or more insulating materials. Initially, the insulating layer 320 encapsulates the hard mask 310, the free layer 304, the tunnel barrier layer 303, the reference layer 302, and the spacer 305. The insulating layer 320 is deposited on the exposed surface and sidewalls of the hard mask 310, sidewalls of the MTJ 306, and sidewalls of the spacer 305.

The insulating layer 320 may be formed by performing a deposition process, for example, plasma enhanced chemical vapor deposition (PECVD), CVD, PVD, IBD, or other like processes. Non-limiting examples of materials for the insulating layer 320 include silicon nitride, aluminum oxide ($Al_2O_3$), amorphous carbon (a-C), silicon SiBCN, SiOCN, or any combination thereof.

The thickness of the insulating layer 320 may generally vary and is not intended to be limited. In some embodiments, the thickness of the insulating layer 320 is in a range from about 10 to about 60 nm. In other embodiments, the thickness of the insulating layer 320 is in a range from about 20 to about 40 nm.

Initially, the insulating layer 320 covers the hard mask 310 and contacts sidewalls of the hard mask 110, free layer 304, tunnel barrier layer 303, reference layer 302, and spacer 305. Then the insulating layer 303 is etched to expose the surface of the hard mask 110. The insulating layer 320 may be etched during the ILD layer 330 trench etch process, discussed below.

The ILD layer 330 is deposited on the contact electrode 301 and the hard mask 310 and around the MTJ stack 306 and spacer 305. The ILD layer 330 may include a low-k dielectric oxide, including but not limited to, silicon dioxide, spin-on-glass, a flowable oxide, a high-density plasma oxide, or any combination thereof. The ILD layer 330 may be formed by performing deposition process, including, but not limited to CVD, PVD, plasma enhanced CVD, atomic layer deposition (ALD), evaporation, chemical solution deposition, or like processes.

The ILD layer 330 is etched to form a trench that is then filled with a metal 340. The ILD layer 330 is etched to form a trench that extends to a surface of the hard mask 310, along the sidewalls of the hard mask 310, and along the sidewalls of a portion of the MTJ stack 306. For example, the trench may extend to a level that is parallel to the reference layer 302, the tunnel barrier layer 303, or the free layer 304.

The ILD layer 330 is etched using a wet etch chemical process. For example, a fluorocarbon etch chemistry, e.g., $CF_4$ or $CHF_3$, or a plasma etch chemistry may be employed to form the trench in the ILD layer 330. The insulating layer 320 may also be etched during the trench formation. As the trench in the ILD layer 330 is etched it reaches the top of the hardmask 610, which is covered by insulating layer 320. The exposed portion of the insulating layer 320 is etched away.

A metallization process is employed to deposit a metal 340 into the trench within the ILD layer 330. The metal 340 within the trench forms the top contact electrode. The metal 340 may be deposited by performing a deposition process, for example, CVD, PECVD, PVD, plating, thermal or e-beam evaporation, or sputtering. Non-limiting examples of materials for the metal 340 include copper, aluminum, or any combination thereof.

The spacer 305 raises the bottom of the metal 340 containing contact sufficiently far above the contact electrode 301 so that any redeposition 321 collects at the base along sidewalls of the spacer 305 beneath the insulating layer 320, which is far below the tunnel barrier layer 303 where shorting would occur (see FIGS. 1C and 2C). The tunnel barrier layer 303 is substantially free of any redeposited magnetic material because the redeposited magnetic material is confined to sidewalls of the spacer 305. In some embodiments, the MTJ stack 306 is substantially free of redeposted magnetic material.

As described above, various embodiments provide a stack structure and etch processes that reduce the probability of shorting caused by metal redeposition on the MTJ sidewalls, as well as reduce the probability of the trench shorting to the bottom contact. The methods include disposing a conductive spacer layer under the MTJ stack. The conductive spacer layer is deposited as part of the MTJ stack deposition process. RIE and/or IBE processes etch the conducting layer with selectivity against the hard mask. The conducting layer may be, for example, ruthenium (Ru). Although, other metals and semiconductors may be used for the conducting layer. The conductive spacer layer is etched, except for the portion disposed beneath the MTJ stack. The etching also partially recesses the contact/substrate around the STT-MRAM device. The recessed contact/substrate is a source of the magnetic material redeposition. Because the recessed contact/substrate is further away from the tunnel barrier, redeposition is less likely to collect on the tunnel barrier, and therefore, shorting is less likely. Furthermore, since the tunnel barrier is effectively raised further above the bottom contact, a deep trench, which must extend down to a level near the tunnel barrier, is further from the bottom contact, which also eliminates shorting to the bottom contact. Like reference numerals refer to like elements across different embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a magnetic random access memory (MRAM) device, the method comprising:
    depositing a conductive spacer material on an electrode;
    forming a magnetic tunnel junction (MTJ) on the conductive spacer material;
    patterning a hard mask on the MTJ, and then etching the conductive spacer material and the MTJ; and
    forming an insulating layer along a sidewall of the hard mask, the MTJ, and the conductive spacer material.

2. The method of claim 1, wherein the MTJ comprises a magnetic material, and etching the MTJ redeposits a portion of the magnetic material along a portion of a sidewall of the spacer beneath the insulating layer.

3. The method of claim 1, wherein etching the MTJ and the conductive spacer material includes reactive ion etching.

4. The method of claim 1, wherein etching the MTJ and the conductive spacer material includes ion beam etching.

5. The method of claim 1, wherein etching the MTJ and the conductive spacer material does not substantially degrade the hard mask.

6. The method of claim 1, wherein the tunnel barrier layer is substantially free of redeposited magnetic material that accumulates during etching the MTJ.

7. The method of claim 1, wherein the conductive spacer material has a thickness in a range from about 20 to about 50 nanometers (nm).

8. The method of claim 1, wherein the conductive spacer material comprises ruthenium.

9. The method of claim 1, wherein the hard mask comprises tantalum nitride.

10. The method of claim 1, wherein the MTJ comprises a reference layer, a free layer, and a tunnel barrier layer arranged between the reference layer and the free layer.

11. The method of claim 10, wherein a sidewall of the tunnel barrier layer is substantially free of the redeposited portion of the magnetic material.

12. The method of claim 11, wherein the tunnel barrier layer comprises magnesium oxide.

13. The method of claim 1, wherein depositing the conductive spacer material comprises physical vapor deposition.

14. The method of claim 1, wherein depositing the conductive spacer material comprises ion beam deposition.

15. The method of claim 1, wherein depositing the conductive spacer material comprises atomic layer deposition.

16. The method of claim 1, wherein the conductive spacer material is niobium.

17. The method of claim 1, wherein the conductive spacer material is palladium.

18. The method of claim 1, wherein the conductive spacer material is a highly doped semiconductor material.

19. The method of claim 1, wherein the conductive spacer material is doped polysilicon.

20. The method of claim 2, wherein the redeposited magnetic material is confined to the sidewall of the spacer.

* * * * *